(12) United States Patent
Takahashi et al.

(10) Patent No.: US 7,976,361 B2
(45) Date of Patent: Jul. 12, 2011

(54) POLISHING APPARATUS AND POLISHING METHOD

(75) Inventors: Tamami Takahashi, Tokyo (JP); Masaya Seki, Tokyo (JP); Hiroaki Kusa, Tokyo (JP); Kenya Ito, Tokyo (JP)

(73) Assignee: Ebara Corporation, Tokyo (JP)

( * ) Notice: Subject to any disclaimer, the term of this patent is extended or adjusted under 35 U.S.C. 154(b) by 547 days.

(21) Appl. No.: 12/213,186

(22) Filed: Jun. 16, 2008

(65) Prior Publication Data
US 2009/0004952 A1    Jan. 1, 2009

(30) Foreign Application Priority Data
Jun. 29, 2007  (JP) .................................. 2007-171959

(51) Int. Cl.
*B24B 1/00* (2006.01)
(52) U.S. Cl. ............ 451/44; 451/59; 451/303; 451/304; 451/307
(58) Field of Classification Search ............... 451/41, 451/43, 44, 59, 296, 303, 304, 306, 307
See application file for complete search history.

(56) References Cited

U.S. PATENT DOCUMENTS

| | | | |
|---|---|---|---|
| 6,558,239 B2 * | 5/2003 | Kunisawa et al. | 451/303 |
| 6,685,539 B1 * | 2/2004 | Enomoto et al. | 451/41 |
| 7,066,787 B2 * | 6/2006 | Nakanishi et al. | 451/6 |
| 7,621,799 B2 * | 11/2009 | Sakairi | 451/36 |
| 7,744,445 B2 * | 6/2010 | Kubota et al. | 451/41 |
| 2001/0011002 A1 * | 8/2001 | Steere, III | 451/168 |
| 2002/0098787 A1 * | 7/2002 | Kunisawa et al. | 451/307 |
| 2004/0185751 A1 | 9/2004 | Nakanishi et al. | |
| 2006/0252355 A1 * | 11/2006 | Kumasaka | 451/44 |
| 2007/0131654 A1 * | 6/2007 | Wasinger et al. | 216/88 |
| 2008/0188167 A1 * | 8/2008 | Ishii et al. | 451/307 |
| 2008/0200100 A1 | 8/2008 | Takahashi et al. | |
| 2008/0293335 A1 * | 11/2008 | Ettinger et al. | 451/41 |
| 2009/0017733 A1 * | 1/2009 | Takahashi et al. | 451/57 |
| 2009/0036042 A1 * | 2/2009 | Shin et al. | 451/398 |
| 2009/0117828 A1 * | 5/2009 | Hongo et al. | 451/6 |
| 2010/0136886 A1 * | 6/2010 | Hongo et al. | 451/6 |

FOREIGN PATENT DOCUMENTS

| | | |
|---|---|---|
| JP | 09-085599 | 3/1997 |
| WO | 2006/112530 | 10/2006 |
| WO | 2006/112532 | 10/2006 |

OTHER PUBLICATIONS

European Search Report issued on Oct. 31, 2008 in European Application No. 08 011343.

\* cited by examiner

*Primary Examiner* — Eileen P. Morgan
(74) *Attorney, Agent, or Firm* — Wenderoth, Lind & Ponack, L.L.P.

(57) ABSTRACT

A polishing apparatus is suitable for use in polishing a periphery of a substrate, such as a semiconductor wafer. The polishing apparatus includes a holding section configured to hold a workpiece and a polishing head configured to bring a polishing tape into contact with the workpiece. The polishing apparatus also includes a supply reel configured to supply the polishing tape to the polishing head, a rewind reel configured to rewind the polishing tape that has contacted the workpiece, and a swinging mechanism configured to cause the polishing head to perform a swinging motion with its pivot at a predetermined point.

13 Claims, 12 Drawing Sheets

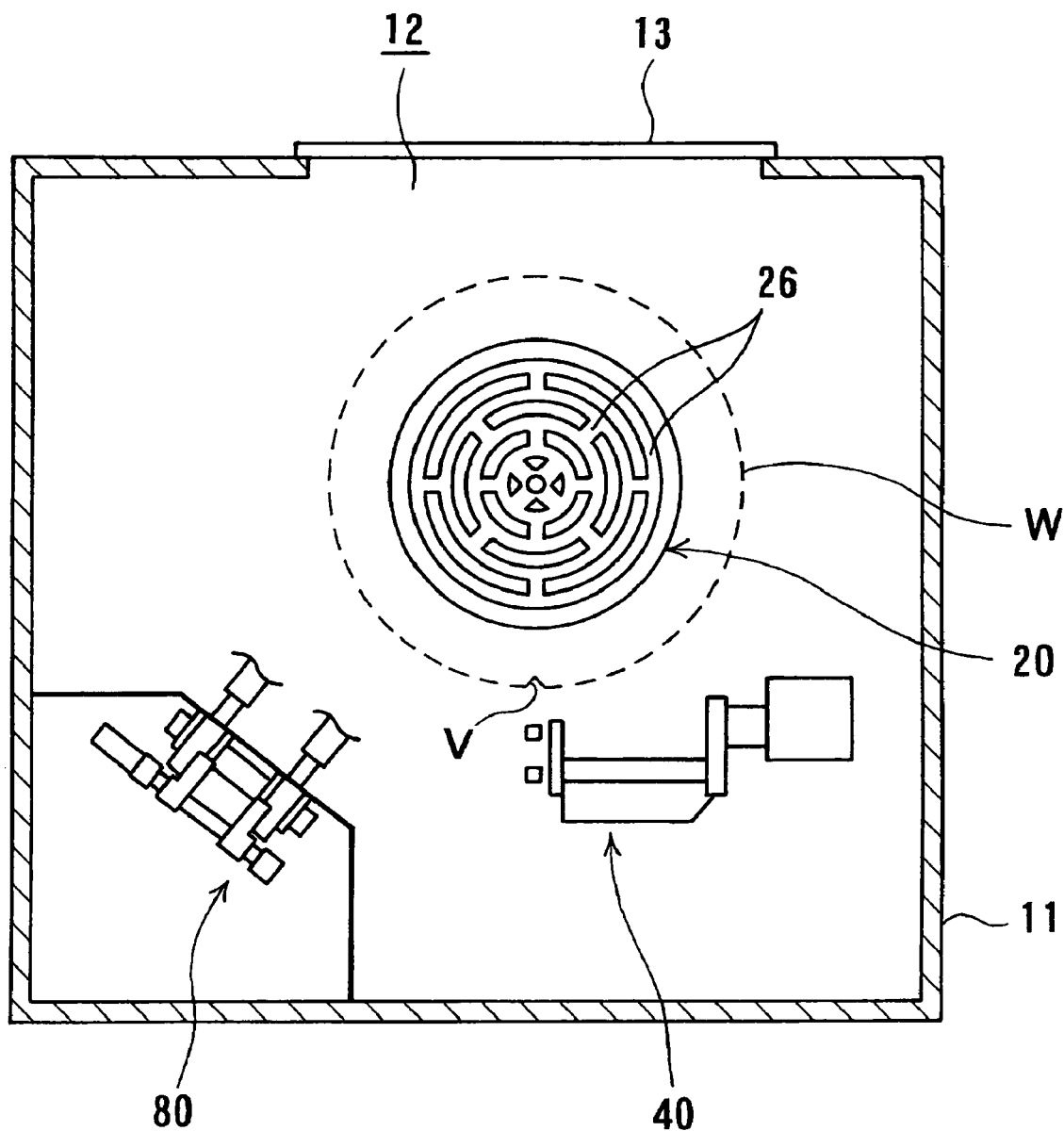

POLISHING APPARATUS AND POLISHING METHOD

BACKGROUND OF THE INVENTION

1. Field of the Invention

The present invention relates to a polishing apparatus and polishing method for polishing a substrate such as a semiconductor wafer, and more particularly to a polishing apparatus and polishing method for polishing a periphery of a substrate using a polishing tape.

2. Description of the Related Art

From a viewpoint of improving a yield in semiconductor fabrications, management of a surface condition in a periphery of a semiconductor wafer has recently been drawing attention. In semiconductor fabrication processes, a number of materials are deposited on a wafer repeatedly to form multilayer structures. As a result, unwanted materials and roughened surface are formed on a periphery which is not used for products. In recent years, it has become more common to transfer the wafer by holding only the periphery of the wafer. Under such circumstances, the unwanted materials could come off the periphery onto devices formed on the wafer during several processes, resulting in a lowered yield. Thus, it has been customary to polish the periphery of the wafer using a polishing apparatus to remove an unwanted copper film and the roughened surface.

FIG. 1 is a schematic view of a conventional polishing apparatus for polishing a periphery of a wafer. As shown in FIG. 1, this type of polishing apparatus has a wafer stage unit 120 configured to hold a wafer W, a polishing head 142 configured to press a polishing tape 141 against a periphery of the wafer W, a supply reel 145a for supplying the polishing tape 141 to the polishing head 142, and a rewind reel 145b for rewinding the used polishing tape 141. The supply reel 145a and the rewind reel 145b are rotated so as to supply and rewind the polishing tape 141. The supply reel 145a and the rewind reel 145b are fixed to a stationary member that is part of the polishing apparatus.

The polishing head 142 has a tape transfer mechanism 143 therein. This tape transfer mechanism 143 has a tape-transferring roller and a holding roller. The polishing tape 141 is interposed between the tape-transferring roller and the holding roller, while the tape-transferring roller is rotated to thereby transfer the polishing tape 141. The polishing tape 141 is pulled toward the polishing head 142 by the tape transfer mechanism 143. A travel direction of the polishing tape 141 is guided by guide rollers 157a, 157b, 157c, 157d, 157e such that the polishing tape 141 is placed in contact with the periphery of the wafer W. After contacting the periphery of the wafer W, the polishing tape 141 is rewound by the rewind reel 145b. The supply reel 145a and the rewind reel 145b are coupled to non-illustrated motors that provide the polishing tape 141 with a suitable tension. The polishing head 142 performs a linearly-reciprocating motion in vertical directions, as indicated by arrows in FIG. 1, to thereby provide relative movement between the polishing tape 141 and the wafer W, thus polishing the periphery of the wafer W.

FIG. 2 is a plan view illustrating mechanisms for the linearly-reciprocating motion of the polishing head 142. FIGS. 3A through 3D are views taken along line III-III in FIG. 2.

The polishing head 142 is fixed to one end of a movable arm 160, and a cam shaft 161 is provided at another end of the movable arm 160. The movable arm 160 is supported by a support arm 162 via linear guides 163. These linear guides 163 are configured to guide movement of the movable arm 160 so as to allow the movable arm 160 to move linearly relative to the support arm 162. A motor M for driving the cam shaft 161 is mounted on the support arm 162. This motor M has a rotational shaft coupled to the cam shaft 161 via pulleys p101 and p102 and a belt b100. The rotational shaft of the motor M and the cam shaft 161 are rotatably supported by bearings 164A and 164B mounted on the support arm 162. The cam shaft 161 has an eccentric shaft 161a which is off-centered with respect to a central axis of the bearing 164B. A cam 165 is mounted on a tip end of the eccentric shaft 161a. This cam 165 is fitted into a groove 166 of a U-shaped portion of the movable arm 160 (see FIG. 3A).

As the motor M is energized, the cam shaft 161 is rotated via the pulleys p101 and p102 and the belt b100. Since the eccentric shaft 161a is rotated eccentrically with its central axis deviating from the central axis of the bearing 164B, the cam 165 is also rotated eccentrically. As shown in FIGS. 3A through 3D, eccentric rotation of the cam 165 in the groove 166 causes the movable arm 160 to perform a linearly-reciprocating motion in vertical directions, thus causing the polishing head 142 on the tip end of the movable arm 160 to perform a linearly-reciprocating motion in vertical directions.

The tape transfer mechanism 143 is operable to transfer the polishing tape 141 from the supply reel 145a to the rewind reel 145b at a constant speed. On the one hand this tape-transferring speed is very low, and on the other hand a speed of the polishing head 142 reciprocating linearly is very high. Therefore, in the tape supplying and rewinding operations of the supply reel 145a and the rewind reel 145b, which will be discussed later, the tape-transferring speed is practically negligible as compared with the speed of the reciprocating polishing head 142.

FIGS. 4A through 4C are views illustrating the operations of the polishing head 142, the supply reel 145a, and the rewind reel 145b. In FIGS. 4A through 4C, reference symbols A and B represent certain points on the polishing tape 141 attached to the supply reel 145a and the rewind reel 145b.

FIG. 4A shows a state in which a center Ch of the polishing head 142 is aligned with a thickness center Cw of the wafer W (which will be hereinafter referred to as simply a wafer center). The wafer center Cw is fixed in position during polishing. On the other hand, the polishing head 142 performs the linearly-reciprocating motion across the wafer center Cw.

FIG. 4B shows a state in which the polishing head 142 is linearly moved downwardly from the wafer center Cw. During this downward movement, the polishing tape 141 is pulled from the supply reel 145a and the rewind reel 145b, and the points A and B on the polishing tape 141 are moved downwardly, as shown in FIG. 4B. As a result, the supply reel 145a and the rewind reel 145b are rotated through a certain angle corresponding to a length of the polishing tape 141 that has been pulled out.

FIG. 4C shows a state in which the polishing head 142 is linearly moved upwardly from the wafer center Cw. During this upward movement, the polishing tape 141 is rewound by the supply reel 145a and the rewind reel 145b, and the points A and B on the polishing tape 141 are moved upwardly, as shown in FIG. 4C. As a result, the supply reel 145a and the rewind reel 145b are rotated through a certain angle corresponding to a length of the polishing tape 141 that has been rewound. In this manner, in accordance with a change in distance between the polishing head 142 and the supply and rewind reels 145a and 145b, the supply reel 145a and the rewind reel 145b repeat supply and rewind of the polishing tape 141, as shown in FIGS. 4B and 4C.

However, as the supply reel 145a and the rewind reel 145b repeat supply and rewind of the polishing tape 141, the tension of the polishing tape 141 would change when the supply and rewind operations are switched, resulting in unstable polishing performance. In particular, as the reciprocating motion becomes faster, an excessive tension could be exerted on the polishing tape 141 when the supply and rewind operations are switched. As a result, the polishing tape 141 would be cut or stretch (i.e., permanent strain). On the other hand, the tension of the polishing tape 141 could be zero when the supply and rewind operations are switched. As a result, the polishing tape 141 slackens, and a desired polishing performance cannot be obtained.

If the reciprocating speed of the polishing head 142 can be increased, a removal amount of materials per unit time (i.e., a polishing speed or a removal rate) can be increased. Therefore, the polishing performance of the polishing apparatus can be improved. However, because of the above-described problems, the reciprocating speed of the polishing head 142 cannot be increased so high. In order to solve such problems, the supply reel 145a may be incorporated in the polishing head 142. In this case, however, a motor for providing the polishing tape with a tension becomes heavy. Moreover, if a long polishing tape 141 is to be used, the supply reel 145a is required to be large. This means that the polishing head 142 and the drive mechanisms for the reciprocating motion are required to be large in size.

SUMMARY OF THE INVENTION

The present invention has been made in view of the above drawbacks. It is therefore an object of the present invention to provide a polishing apparatus and a polishing method capable of providing a polishing tape with a substantially constant tension during polishing, and capable of improving a removal rate.

In order to solve the above drawbacks, according to one aspect of the present invention, there is provided a polishing apparatus for polishing a workpiece by providing relative movement between a polishing tape and the workpiece. This apparatus includes: a holding section configured to hold the workpiece; a polishing head configured to bring the polishing tape into contact with the workpiece; a supply reel configured to supply the polishing tape to the polishing head; a rewind reel configured to rewind the polishing tape that has contacted the workpiece; and a swinging mechanism configured to cause the polishing head to perform a swinging motion.

In a preferred aspect of the present invention, the polishing tape extends from the supply reel via a pivot of the swinging motion of the polishing head to the workpiece.

In a preferred aspect of the present invention, the pivot of the swinging motion is positioned in the polishing head.

In a preferred aspect of the present invention, the workpiece comprises a semiconductor wafer having a notch portion formed in a periphery thereof; and the polishing head is configured to bring the polishing tape into contact with the notch portion.

Another aspect of the present invention is to provide a polishing apparatus including a holding section configured to hold the workpiece; a polishing head configured to bring the polishing tool into contact with the workpiece; a swinging mechanism configured to cause the polishing head to perform a swinging motion; and a tilting mechanism configured to tilt the polishing head and the swinging mechanism with respect to a surface of the workpiece.

In a preferred aspect of the present invention, the polishing tool comprises a polishing tape; the polishing apparatus further comprises a supply reel configured to supply the polishing tape to the polishing head, and a rewind reel configured to rewind the polishing tape that has contacted the workpiece; and the polishing tape extends from the supply reel via a pivot of the swinging motion of the polishing head to the workpiece.

In a preferred aspect of the present invention, the swinging mechanism includes (i) a swing arm to which the polishing head is fixed, (ii) a support arm rotatably coupled to the swing arm via a connecting shaft, and (iii) a drive mechanism configured to cause the swing arm to perform a swinging motion with its pivot lying on a central axis of the connecting shaft. The tilting mechanism includes (i) a rotatable support shaft supporting the support arm, and (ii) a rotating mechanism configured to rotate the support shaft.

In a preferred aspect of the present invention, the connecting shaft and the support shaft are arranged in parallel with each other.

In a preferred aspect of the present invention, the swinging motion of the polishing head comprises rotation of the polishing head in a clockwise direction and a counterclockwise direction alternately through the same angle from a reference line, which intersects the central axis of the connecting shaft and a central axis of the support shaft at a right angle.

Another aspect of the present invention is to provide a polishing method of polishing a workpiece by providing relative movement between a polishing tape and the workpiece. This method includes holding the workpiece; bringing the polishing tape by a polishing head into contact with the workpiece, while supplying the polishing tape from a supply reel to the polishing head; and swinging the polishing head.

In a preferred aspect of the present invention, the polishing tape extends from the supply reel via a pivot of the swinging motion of the polishing head to the workpiece.

In a preferred aspect of the present invention, the pivot of the swinging motion is positioned in the polishing head.

In a preferred aspect of the present invention, the workpiece comprises a semiconductor wafer having a notch portion formed in a periphery thereof; and the bringing the polishing tape by a polishing head into contact with the workpiece comprises bringing the polishing tape by the polishing head into contact with the notch portion.

Another aspect of the present invention is to provide a polishing method of polishing a workpiece by providing relative movement between a polishing tape and the workpiece. This method includes holding the workpiece; bringing the polishing tape by a polishing head into contact with the workpiece; swinging the polishing head; and while swinging the polishing head, tilting the polishing head with respect to a surface of the workpiece.

In a preferred aspect of the present invention, the polishing tool comprises a polishing tape; and the swinging the polishing head comprises swinging the polishing head while transferring the polishing tape to the workpiece via a pivot of a swinging motion of the polishing head.

According to the present invention, the swinging motion can be performed at a high speed, while keeping a constant tension of the polishing tape. Therefore, a removal amount of materials per unit time, i.e., a removal rate, can be increased, and as a result, a throughput of the polishing apparatus can be improved.

BRIEF DESCRIPTION OF THE DRAWINGS

FIG. 5 is a plan view showing a polishing apparatus according to an embodiment of the present invention;

DETAILED DESCRIPTION OF THE PREFERRED EMBODIMENTS

Embodiments of the present invention will be described below with reference to the drawings.

Figure 1:
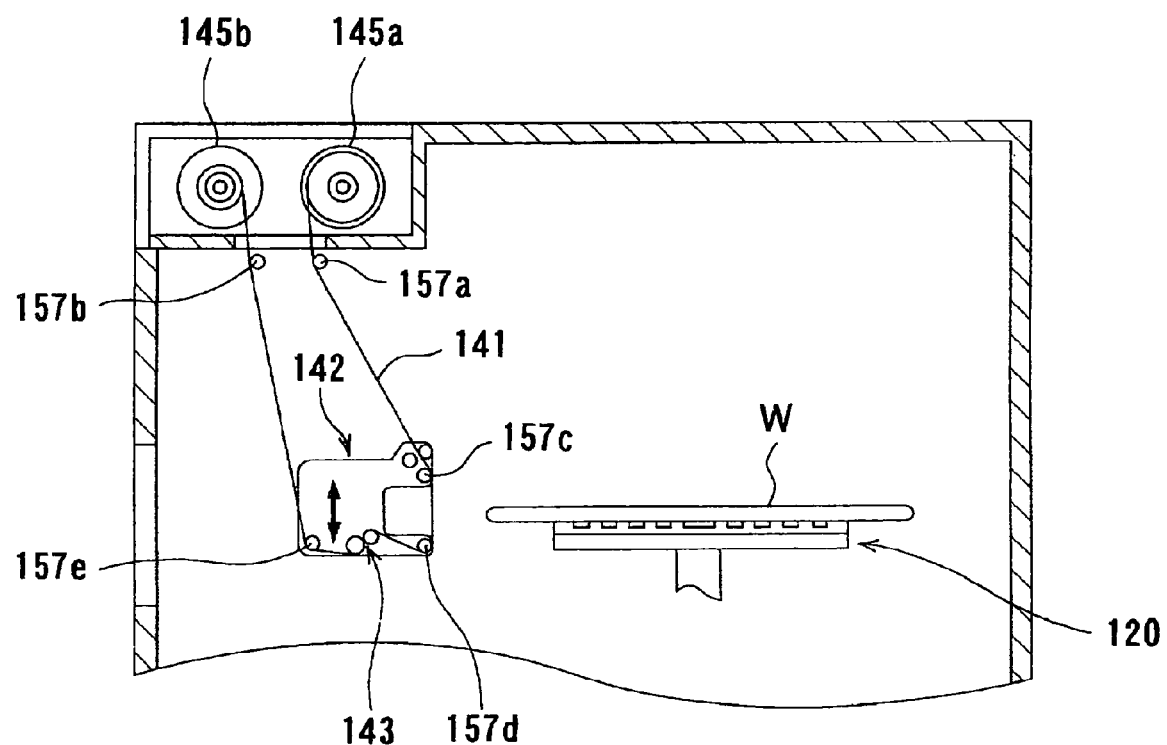
FIG. 1 is a schematic view showing a conventional polishing apparatus for polishing a periphery of a wafer.
Figure 2:
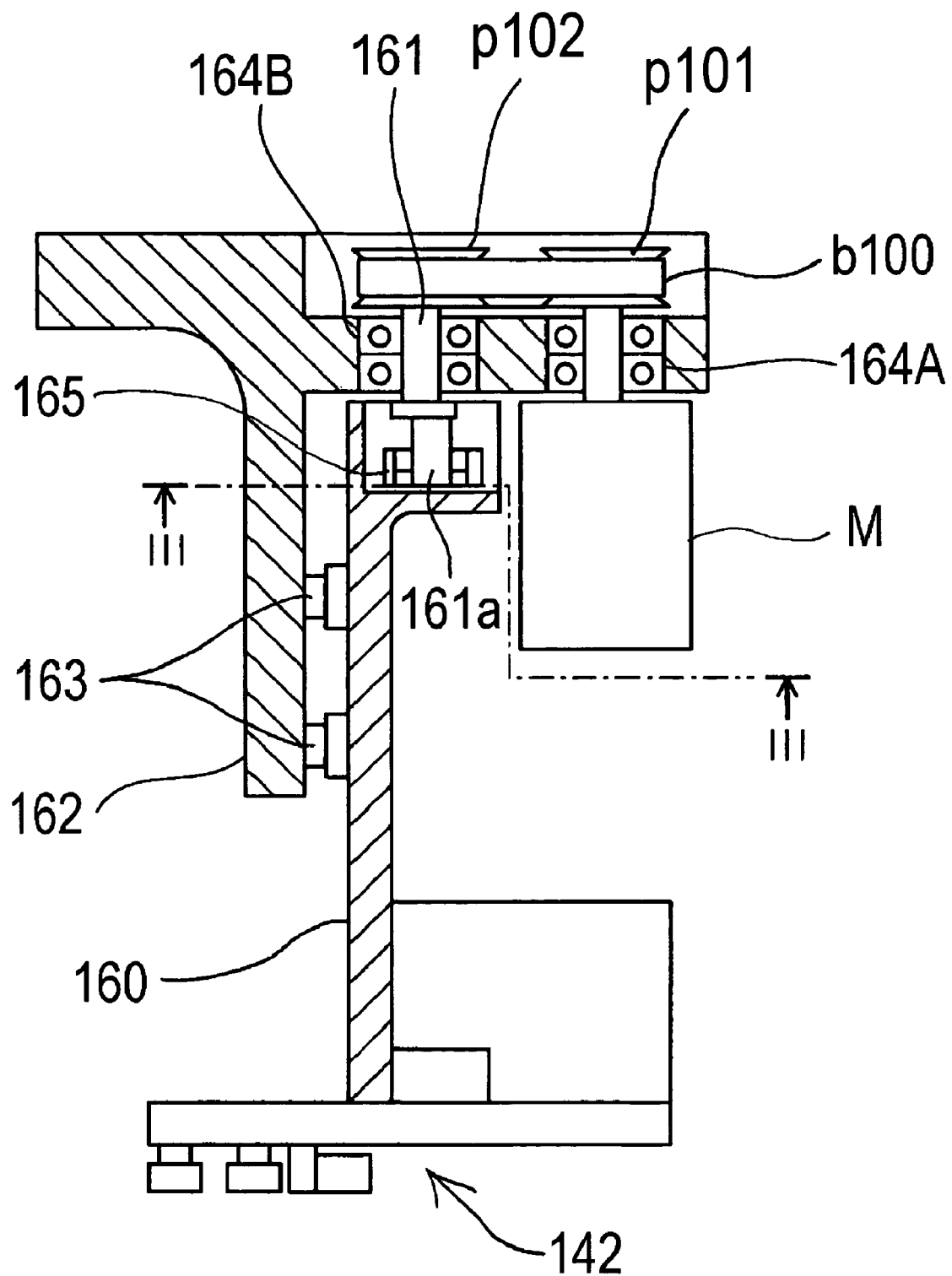
FIG. 2 is a plan view illustrating mechanisms for a linearly-reciprocating motion of a polishing head.
Figure 3A:
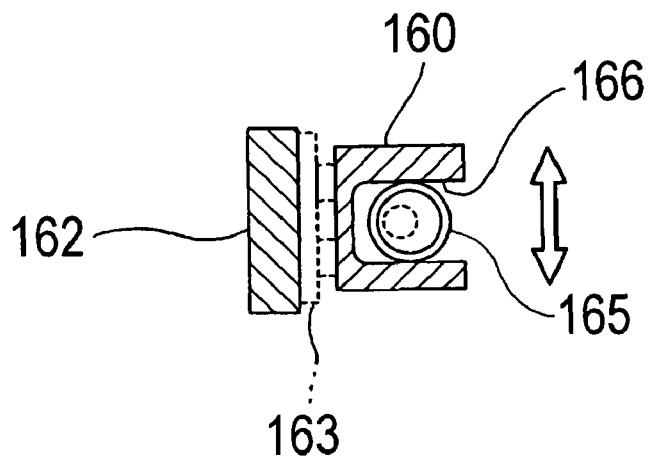
FIGS. 3A through 3D are views taken along line III-III in FIG. 2.
Figure 3B:
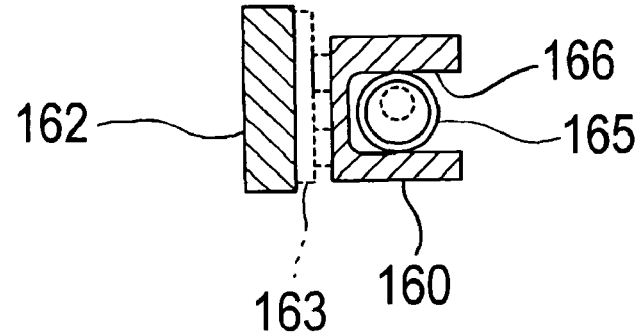
Figure 3C:
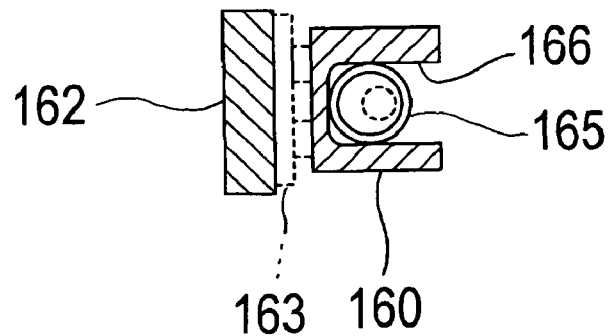
Figure 3D:
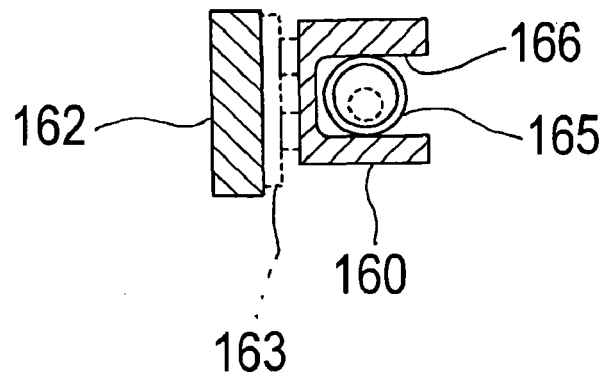
Figure 4A:
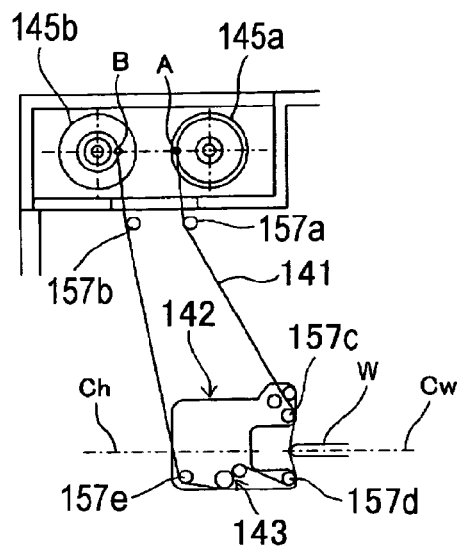
FIGS. 4A through 4C are views illustrating operations of the polishing head, a supply reel, and a rewind reel.
Figure 4B:
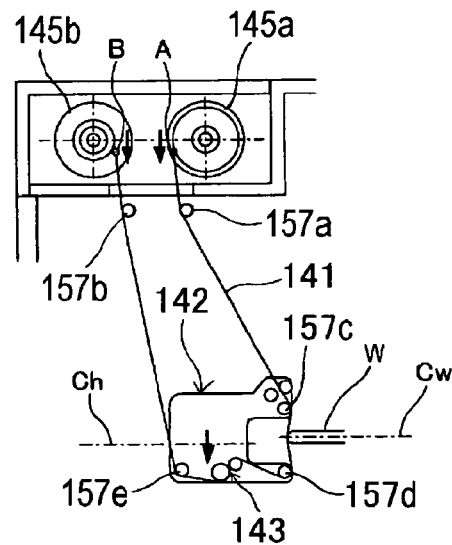
Figure 4C:
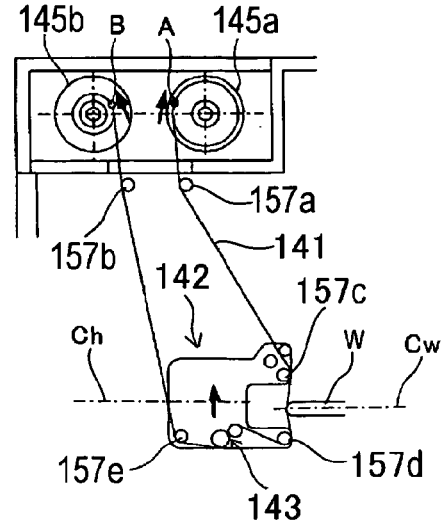
Figure 6:
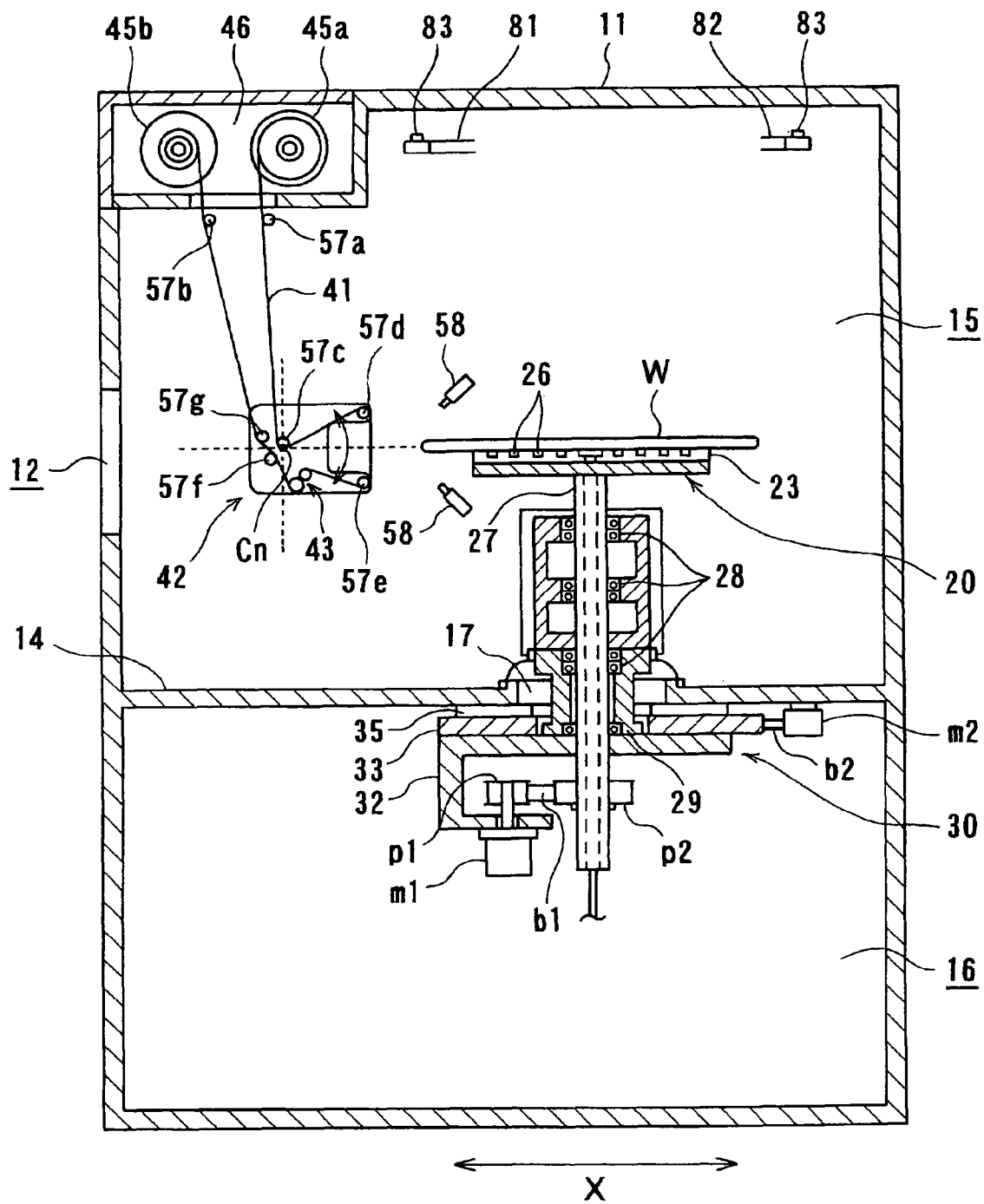
FIG. 6 is a cross-sectional view of the polishing apparatus in FIG. 5.

FIG. 5 is a plan view showing a polishing apparatus according to an embodiment of the present invention. FIG. 6 is a cross-sectional view of the polishing apparatus in FIG. 5. The polishing apparatus according to the embodiment is suitable for use in polishing of a bevel portion and a notch portion of a periphery of a substrate, such as a semiconductor wafer. The bevel portion is a portion where a right-angled edge in the periphery of the wafer has been removed for the purpose of preventing production of chipped pieces and particles of the wafer. The notch portion is a notch formed in the periphery of the wafer for the purpose of facilitating recognition of an orientation (circumferential position) of the wafer. An example of applications of the present invention will be described below. The below-described embodiment is a polishing apparatus for use in polishing a notch portion of a wafer.

As shown in FIGS. 5 and 6, the polishing apparatus according to the embodiment includes a wafer stage unit (substrate holding section) 20 having a wafer stage 23 for holding a wafer W, a stage moving mechanism 30 for moving the wafer stage unit 20 in directions parallel with an upper surface (a wafer holding surface) of the wafer stage 23, and a notch polishing unit 40 for polishing a notch portion V of the wafer W held by the wafer stage 23.

The wafer stage unit 20, the stage moving mechanism 30, and the notch polishing unit 40 are accommodated in a housing 11. This housing 11 has an internal space divided by a partition plate 14 into two spaces: an upper chamber (polishing room) 15 and a lower chamber (machine room) 16. The wafer stage 23 and the notch polishing unit 40 are located in the upper chamber 15, and the stage moving mechanism 30 is located in the lower chamber 16. The upper chamber 15 has a side wall with an opening 12, which can be closed by a shutter 13 that is driven by a non-illustrated air cylinder.

The wafer W is transferred into and out from the housing II through the opening 12. Transferring of the wafer W is performed by a known transfer mechanism (not shown in the drawings) such as a transfer robot. Grooves 26 are formed on the upper surface of the wafer stage 23. These grooves 26 communicate with a non-illustrated vacuum pump via a vertically-extending hollow shaft 27. As the vacuum pump is driven, vacuum is formed in the grooves 26, so that the wafer W is held on the upper surface of the wafer stage 23. The hollow shaft 27 is rotatably supported by bearings 28, and is coupled to a motor m1 via pulleys p1 and p2 and a belt b1. With these arrangements, the wafer W is rotated by the motor m1 with its lower surface being held on the upper surface of the wafer stage 23.

The polishing apparatus further includes a wafer-chucking mechanism 80 arranged in the housing 11. This wafer-chucking mechanism 80 is operable to: receive the wafer W in the housing 11 from the above-described wafer transfer mechanism; place the wafer W onto the wafer stage 23; and remove the wafer W from the wafer stage 23 to the wafer transfer mechanism. In FIG. 5, only part of the wafer-chucking mechanism 80 is depicted.

Figure 7:
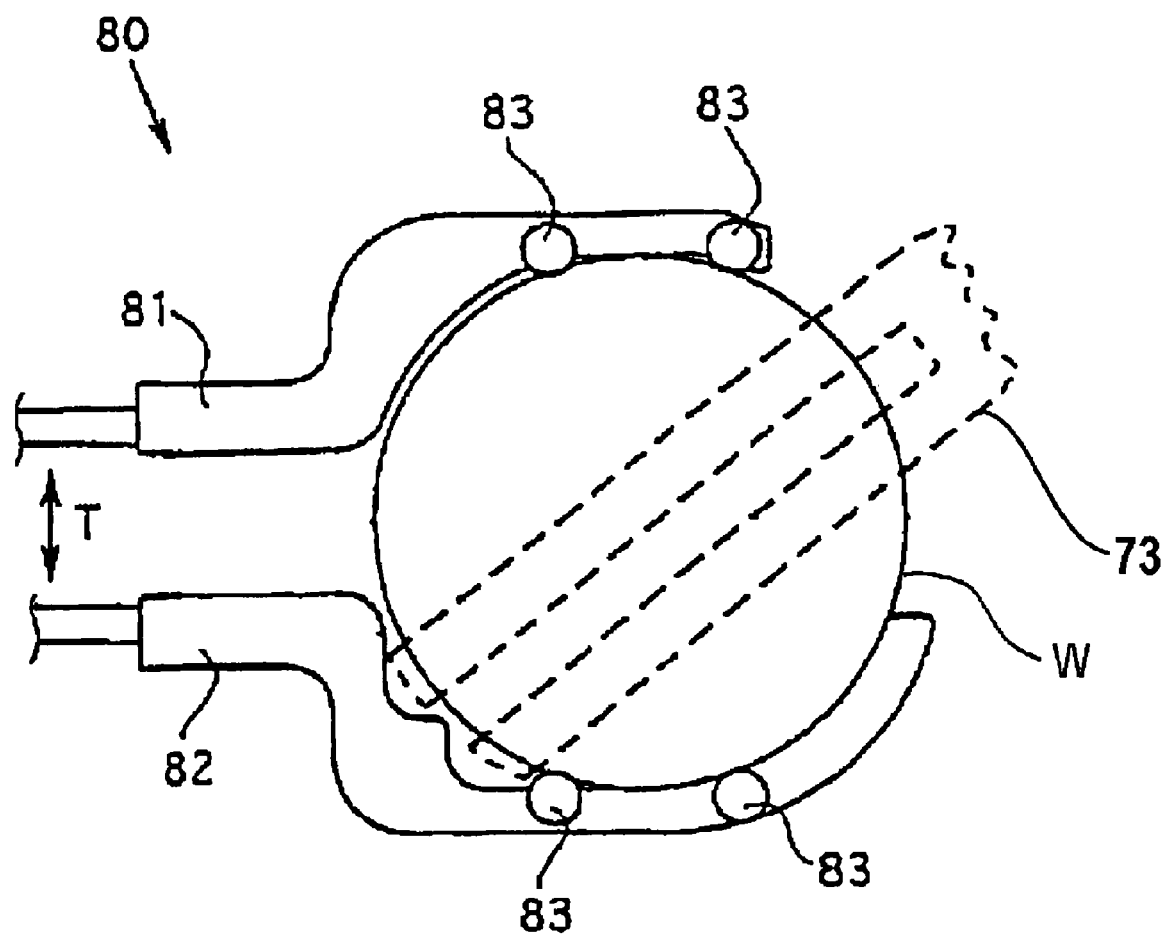
FIG. 7 is a plan view showing chuck hands of a wafer-chucking mechanism.

FIG. 7 is a plan view showing chuck hands of the wafer-chucking mechanism. As shown in FIG. 7, the wafer-chucking mechanism 80 has a first chuck hand 81 having pins 83 thereon and a second chuck hand 82 having pins 83 thereon. These first and second chuck hands 81 and 82 are driven by a non-illustrated open-close mechanism so as to move closer to and away from each other (as indicated by arrows T). A chuck moving mechanism (not shown in the drawings) is further provided so as to move the first and second chuck hands 81 and 82 in directions perpendicular to the surface of the wafer W held on the wafer stage 23.

A hand 73 of the wafer transfer mechanism is operable to transfer the wafer W to a position between the first and second chuck hands 81 and 82. Then, the first and second chuck hands 81 and 82 are moved closer to each other to bring the pins 83 into contact with the periphery of the wafer W, whereby the wafer W is clamped by the first and second chuck hands 81 and 82. In this state, a center of the wafer W and a center of the wafer stage 23 (i.e., a rotational axis of the wafer stage 23) are aligned with each other. Therefore, the first and second chuck hands 81 and 82 can function as a centering mechanism.

As shown in FIG. 6, the stage moving mechanism 30 includes a cylindrical bearing base 29 for rotatably supporting the hollow shaft 27, a support plate 32 on which the bearing base 29 is mounted, a movable plate 33 movable integrally with the support plate 32, a ball screw b2 coupled to the movable plate 33, and a motor m2 adapted to rotate the ball screw b2. The movable plate 33 is coupled to a lower surface of the partition plate 14 via linear guides 35, so that the movable plate 33 is movable in directions parallel with the upper surface of the wafer stage 23. The bearing base 29 extends through a through-hole 17 formed in the partition plate 14. The above-described motor m1 for rotating the hollow shaft 27 is mounted on the support plate 32.

With these arrangements, when the motor m2 rotates the ball screw b2, the movable plate 33, the bearing base 29 and the hollow shaft 27 are moved along a longitudinal direction of the linear guides 35. As a result, the wafer stage 23 is moved in directions parallel to the upper surface thereof In FIG. 6, the movement direction of the wafer stage 23 by the stage moving mechanism 30 is indicated by arrow X.

As shown in FIG. 6, the notch polishing unit 40 includes a polishing tape 41, a polishing head 42 configured to press the polishing tape 41 against the notch portion V of the wafer W, a supply reel 45a configured to supply the polishing tape 41 to the polishing head 42, and a rewind reel 45b configured to rewind the polishing tape 41 that has been supplied to the polishing head 42. The supply reel 45a and the rewind reel 45b are housed in a reel chamber 46 provided on the housing 11. The supply reel 45a and the rewind reel 45b are fixed in position.

The polishing head 42 has a tape transfer mechanism 43 therein. This tape transfer mechanism 43 includes a tape-transferring roller and a holding roller. The polishing tape 41 is interposed between the tape-transferring roller and the holding roller, while the tape-transferring roller is rotated to thereby transfer the polishing tape 41. The polishing tape 41 is pulled out from the supply reel 45a by the tape transfer mechanism 43, and is directed to the polishing head 42 via a guide roller 57a. The polishing head 42 is operable to bring a polishing surface of the polishing tape 41 into contact with the notch portion V of the wafer W. After contacting the notch portion V, the polishing tape 41 is rewound by the rewind reel 45b via a guide roller 57b. As shown in FIG. 6, polishing-liquid supply nozzles 58 are arranged above and below the wafer W, so that a polishing liquid (typically pure water) or cooling water can be supplied onto a contact portion between the wafer W and the polishing tape 41.

The polishing head 42 has guide rollers 57c, 57d, 57e, 57f, and 57g therein arranged so as to guide a travel direction of the polishing tape 41. The polishing head 42 is configured to perform a swinging motion (an oscillating motion) with its pivot lying on a lower end point Cn of the guide roller 57c (i.e., a lowermost end of a outer circumferential surface of the guide roller 57c). More specifically, the polishing head 42 rotates about the point Cn on the guide roller 57c) through a predetermined angle by a swinging mechanism, which will be described below. In the following descriptions, the lower end point Cn of the guide roller 57c will be referred to as a pivot (a center of the swinging motion) Cn.

Figure 8:
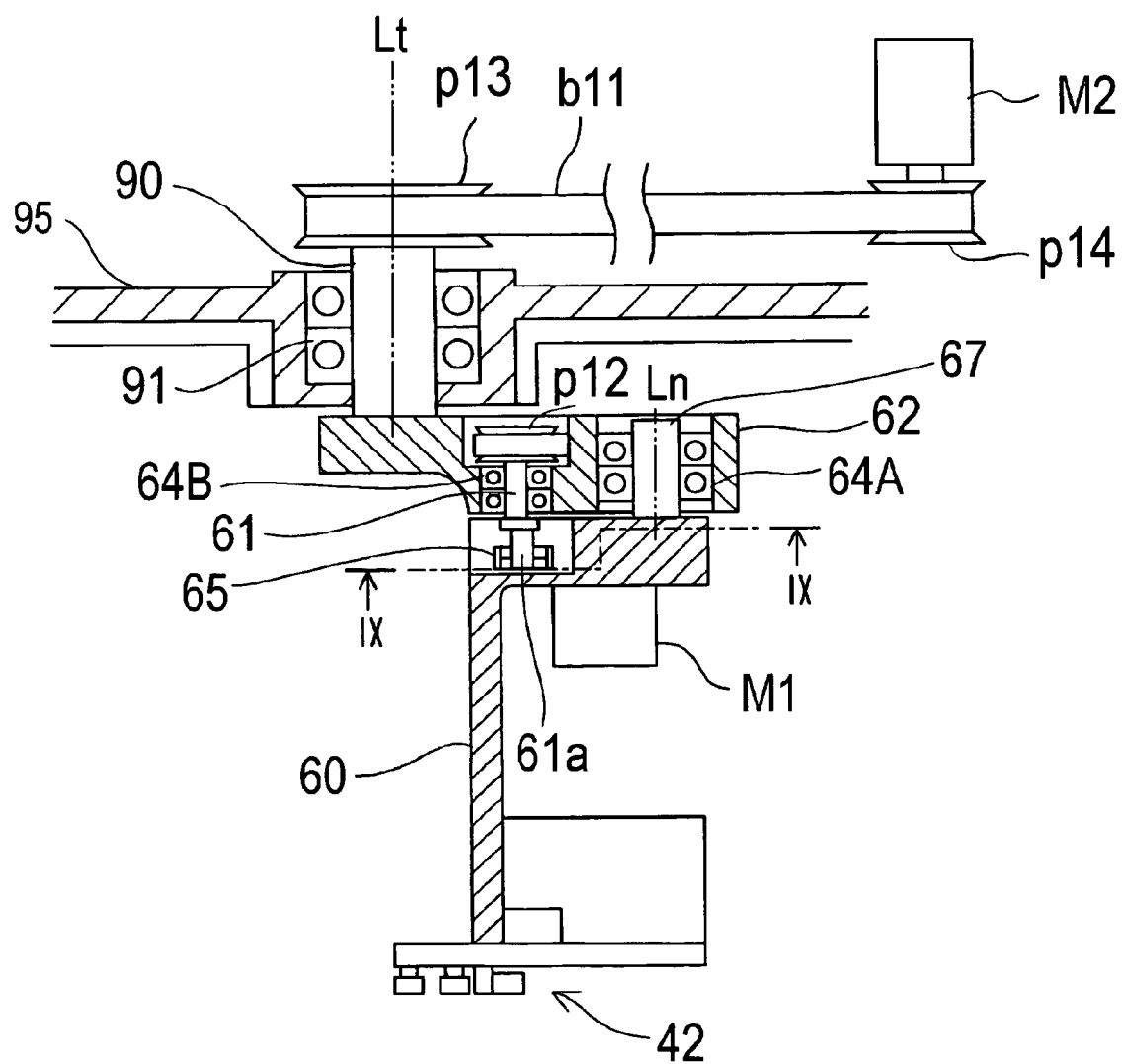
FIG. 8 is a plan view illustrating a swinging mechanism.

FIG. 8 is a plan view illustrating the swinging mechanism, and FIGS. 9A through 9D are views each showing a cross-sectional view taken along line IX-IX in FIG. 8.

As shown in FIG. 8, the swinging mechanism includes a swing arm 60 to which the polishing head 42 is fixed, a support arm 62 supporting the swing arm 60, a connecting arm 67 coupling the swing arm 60 and the support arm 62 to each other, and a drive mechanism adapted to swing the swing arm 60. This drive mechanism includes a cam shaft (crank shaft) 61 having an eccentric shaft 61a, a cam 65 fixed to the cam shaft 61, and a motor M1 serving as a drive source for rotating the cam shaft 61.

The polishing head 42 is mounted on one end of the swing arm 60, and the cam shaft 61 is arranged at another end of the swing arm 60. The connecting shaft 67 is fixed to the swing arm 60 and is rotatably supported by a bearing 64A mounted on the support arm 62, so that the swing arm 60 is rotatable about the connecting shaft 67. The above-mentioned pivot Cn is positioned on a central axis Ln of the connecting shaft 67. The motor M1 is fixed to the support arm 62, and a rotational shaft of the motor M1 is coupled to the cam shaft 61 via pulleys p11 and p12 and a belt b10. The cam shaft 61 is rotatably supported by a bearing 64B mounted on the support arm 62. The eccentric shaft 61a of the cam shaft 61 is off-centered with respect to a central axis of the bearing 64B. The cam 65 is mounted on a tip end of the eccentric shaft 61a. This cam 65 is fitted into a groove 66 of a U-shaped portion of the swing arm 60 (see FIG. 9A).

As the motor M1 is energized, the cam shaft 61 is rotated via the pulleys p11 and p12 and the belt b10. Since the eccentric shaft 61a is rotated eccentrically with its central axis deviating from the central axis of the bearing 64B, the cam 65 is also rotated eccentrically. As shown in FIGS. 9A through 9D, eccentric rotation of the cam 65 in the groove 66 causes the swing arm 60 to perform a swinging motion on the central axis of the connecting shaft 67. As described above, the central axis Ln of the connecting shaft 67 is aligned with the pivot Cn as shown in FIG. 6. Therefore, the polishing head 42, mounted on the tip end of the swing arm 60, performs the swinging motion on the pivot Cn. In the specification, the swinging motion means rotation about a point (the pivot Cn in this embodiment) in a clockwise direction and a counterclockwise direction alternately through a certain angle.

As shown in FIG. 8, the support arm 62 is rotatable about a support shaft 90 fixed thereto so that the polishing head 42 and the swinging mechanism are integrally tilted with respect to a surface of the wafer W. The support shaft 90 extends in parallel with the connecting shaft 67, and is rotatably supported by a bearing 91 mounted on a stationary member 95. The support shaft 90 is coupled to a motor M2 serving as a drive source via pulleys p13 and p14 and a belt b11. A polishing point (a contact point between the polishing tape 41 and the wafer W) is on a central axis Lt of the support shaft 90. Therefore, the polishing head 42 and the swinging mechanism are rotated (i.e., tilted) about the polishing point by rotation of the support shaft 90 driven by the motor M2. In this embodiment, a tilting mechanism for tilting the polishing head 42 is constituted by the support shaft 90, the pulleys p13 and p14, the belt b11, and the motor M2.

Figure 9A:
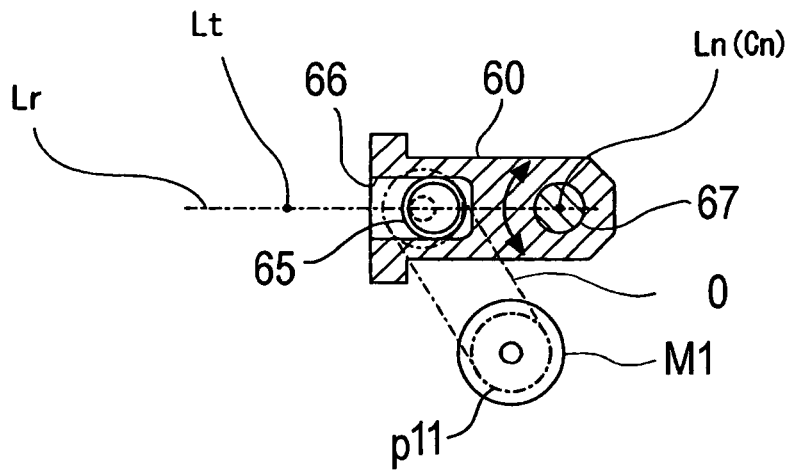
FIGS. 9A through 9D are views each showing a cross-sectional view taken along line IX-IX in FIG. 8.
Figure 9B:
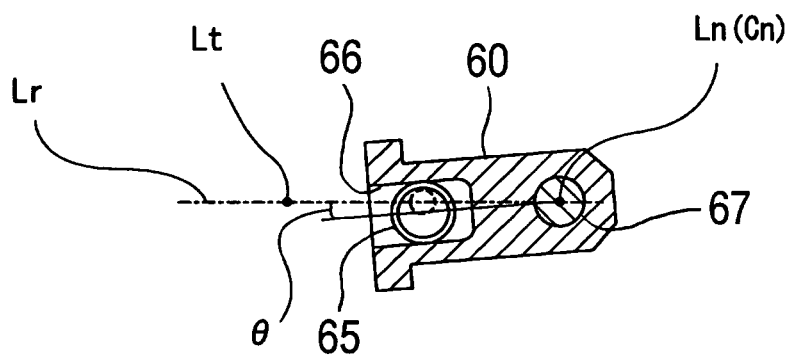
Figure 9C:
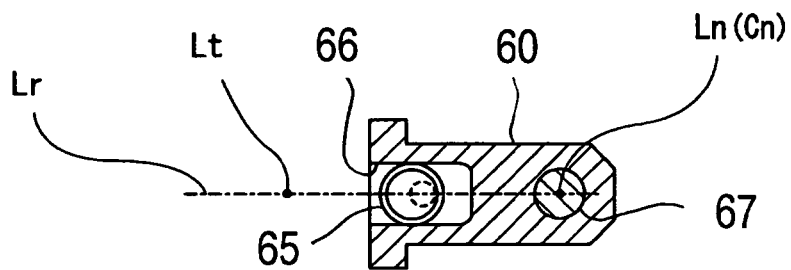
Figure 9D:
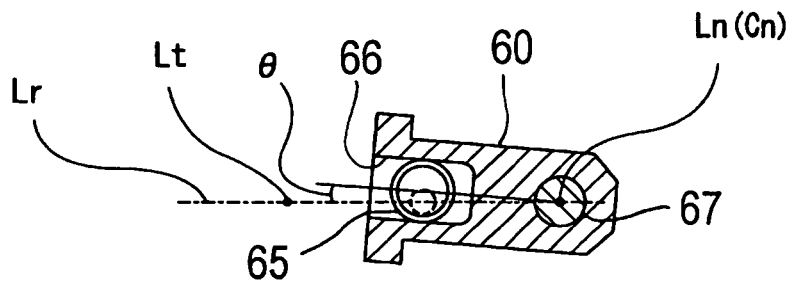

As shown in FIGS. 9A through 9C, a rotational angle θ of the polishing head 42 in the clockwise direction is equal to a rotational angle θ in the counterclockwise direction. More specifically, the polishing head 42 makes the clockwise rotation and counterclockwise rotation through the same angle θ from a reference line Lr. This reference line Lr is defined as a line that intersects the central axis Ln of the connection shaft 67 and the central axis Lt of the support shaft 90 at a right angle. Even when the polishing head 42 is tilted by the tilting mechanism, the swinging motion of the polishing head 42 is performed as well.

Figure 10A:
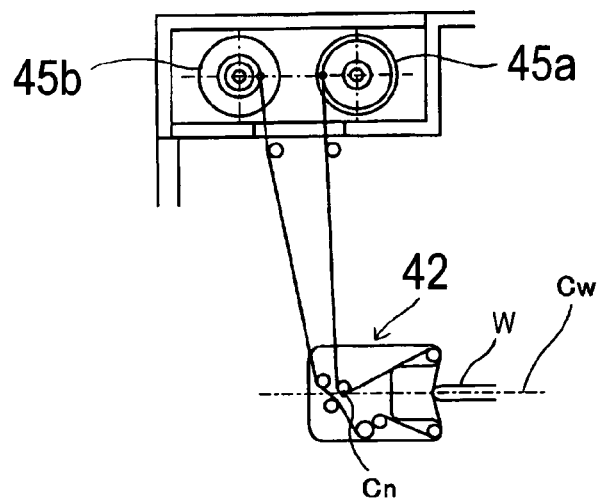
FIGS. 10A through 10C are views for illustrating a tilting motion of a polishing head.
Figure 10B:
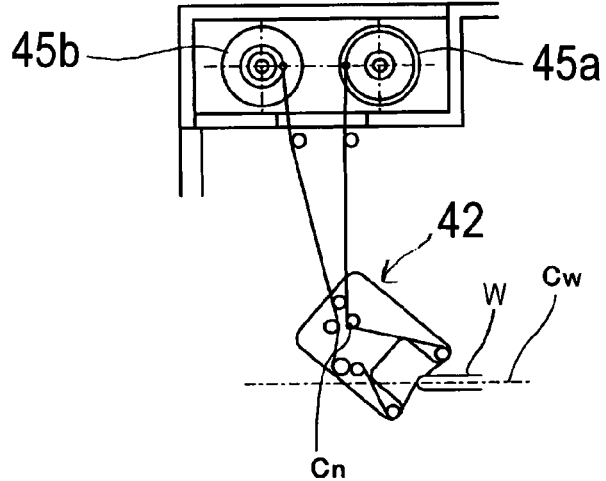
Figure 10C:
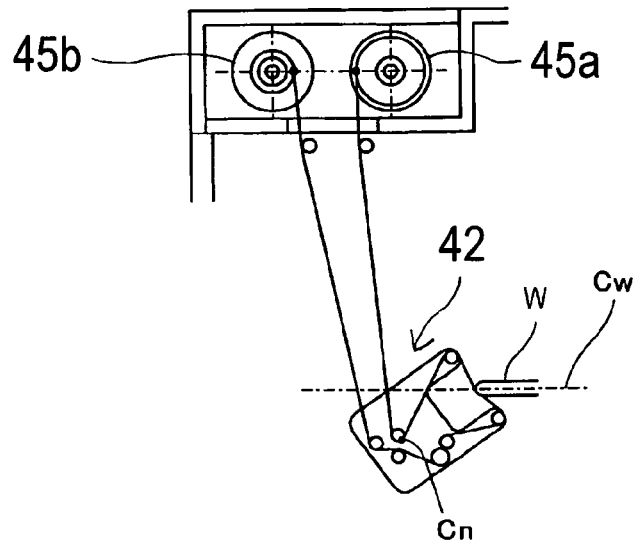

FIGS. 10A through 10C are views for illustrating tilting motion of the polishing head 42. More specifically, FIG. 10A shows a state in which the pivot Cn of the polishing head 42 is aligned with the center Cw of the wafer W, FIG. 10B shows a state in which the polishing head 42 is tilted upwardly, and FIG. 10C shows a state in which the polishing head 42 is tilted downwardly.

Since the swing arm 60 and the polishing head 42 are tilted integrally with the support arm 62, the pivot Cn of the swinging motion is positioned in the polishing head 42 at all times, regardless of a tilting angle of the polishing head 42. Therefore, even when the polishing head 42 is tilted, the polishing head 42 can perform the swinging motion on the pivot Cn. In this swinging motion, the polishing head 42 makes the clockwise rotation and counterclockwise rotation about the pivot Cn through the same angle, regardless of an angle of the polishing head 42 tilted.

The polishing tape 41, supplied from the supply reel 45a, is guided by the guide roller 57a and the guide roller 57c so as to extend via the pivot Cn to the guide roller 57d and the guide roller 57e which are provided on a front end of the polishing head 42. The guide roller 57d is arranged above the guide roller 57e. The travel direction of the polishing tape 41 is guided by these guide roller 57d and the guide roller 57e so that the polishing tape 41 contacts the wafer W.

The supply reel 45a and the rewind reel 45b are coupled to non-illustrated motors that provide the polishing tape 41 with a suitable tension, so that the polishing tape 41 does not slacken. The tape transfer mechanism 43 is operable to transfer the polishing tape 41 from the supply reel 45a to the rewind reel 45b at a constant speed. This tape-transferring speed is several millimeters to tens of millimeters per minute. On the other hand, a swinging speed of the polishing head 42 is as high as several hundred times per minute. Therefore, the tape-transferring speed is practically negligible as compared with the swinging speed of the polishing head 42.

The polishing tape 41 may comprise a base film having a polishing surface to which abrasive particles, such as diamond particles or SiC particles, are attached. The abrasive particles to be attached to the polishing tape 41 are selected in accordance with a type of wafer and a polishing performance required. For example, the abrasive particles may be diamond particles or SiC particles having an average diameter in a range of 0.1 μm to 5.0 μm. The polishing tape 42 may be a belt-shaped polishing cloth with no abrasive particles. The base film may comprise a film made from a flexible material, such as polyester, polyurethane, or polyethylene terephthalate.

Next, operations of the polishing apparatus having the above-described structures will be described. The wafer W is transferred by the non-illustrated wafer transfer mechanism into the housing 11 through the opening 12. The wafer-chucking mechanism 80 receives the wafer W from the hand 73 (see FIG. 7) of the wafer transfer mechanism, and clamps the wafer W by the first and second chuck hands 81 and 82. After the first and second chuck hands 81 and 82 receives the wafer W, the hand 73 of the wafer transfer mechanism is removed from the housing 11, and then the shutter 13 is closed. The wafer-chucking mechanism 80 is moved downwardly to lower the wafer W and place the wafer W onto the upper surface of the wafer stage 23. Then, the non-illustrated vacuum pump operates to attract the wafer W to the upper surface of the wafer stage 23.

The wafer stage 23, holding the wafer W, is moved by the stage moving mechanism 30 to a position near the polishing head 42. The motor m1 is energized to rotate the wafer stage 23 so that the notch portion V of the wafer W faces the polishing head 42. Then, the polishing liquid is supplied to the wafer W from the polishing liquid supply nozzles 58. After a flow rate of the polishing liquid as supplied reaches a predetermined value, the wafer W is moved by the stage moving mechanism 30 until the wafer W is brought into contact with the polishing tape 41. Then, the swinging mechanism operates to cause the polishing head 42 to perform the swinging motion. As a result, the polishing tape 41 oscillates in directions perpendicular to the surface of the wafer W, and the polishing surface of the polishing tape 41 is placed in sliding contact with the notch portion V In this manner, the notch portion V of the wafer W is polished. Further, the polishing head 42 is tilted so that the polishing tape 41 contacts the wafer W at varying angles, whereby the notch portion V in its entirety is polished from its upper surface to its lower surface.

Figure 11A:
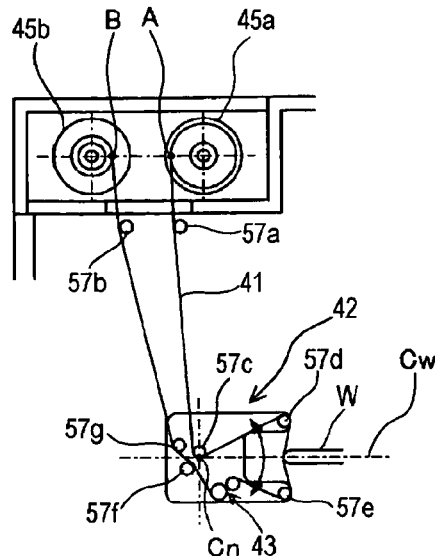
FIGS. 11A through 11C are views each showing part of the polishing apparatus in FIG. 6.
Figure 11B:
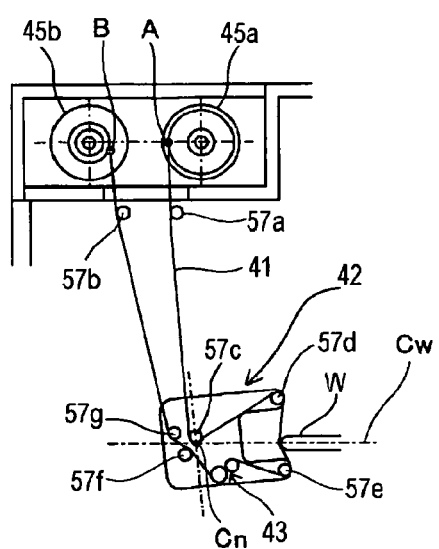
Figure 11C:
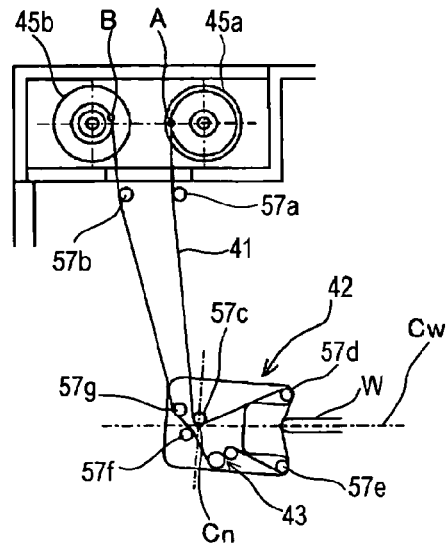

FIGS. 11A through 11C are views each showing part of the polishing apparatus shown in FIG. 6. Hereinafter, operations of the polishing head 42, the supply reel 45a, and the rewind reel 45b when the polishing head 42 is performing the swinging motion will be described with reference to FIGS. 11A through 11C. In FIGS. 11A through 11C, reference symbols A and B represent certain points on the polishing tape 41 attached to the supply reel 45a and the rewind reel 45b. As described above, the transferring speed of the polishing tape 41 is practically negligible as compared with the speed of the swinging motion of the polishing head 42. Therefore, the following descriptions assume that the transferring speed of the polishing tape 41 is zero.

FIG. 11A illustrates a state in which the pivot Cn lies in the same plane as the center line (the center in thickness direction) Cw of the wafer W. As indicated by arrows, the polishing head 42 performs the swinging motion on the pivot Cn that is located in the polishing head 42. Therefore, a distance between the supply reel 45a and the pivot Cn is constant at all times, regardless of whether the polishing head 42 is performing the swinging motion.

FIG. 11B illustrates a state in which the front end of the polishing head 42 moves upwardly during the swinging motion. During this upward movement, the length of the polishing tape 41 that lies between the supply reel 45a and the guide roller 57c on the pivot Cn does not substantially change. The length of the polishing tape 41 that lies between the guide roller 57c and the guide roller 57d arranged on the front end of the polishing head 42 does not substantially change as well. Therefore, as can be seen from FIGS. 11A and 11B, the point A at the supply-reel side stays substantially in its original position, and the point B at the rewind-reel side moves slightly.

FIG. 11C illustrates a state in which the front end of the polishing head 42 moves downwardly during the swinging motion. During this downward movement, the length of the polishing tape 41 that lies between the supply reel 45a and the guide roller 57c on the pivot Cn does not substantially change. The length of the polishing tape 41 that lies between the guide roller 57c and the guide roller 57d does not substantially change as well. Therefore, as can be seen from FIGS. 11A and 11C, the point A at the supply-reel side stays substantially in its original position, and the point B at the rewind-reel side moves slightly.

As shown in FIGS. 11B and 11C, the swinging motion of the polishing head 42 provides relative movement between the wafer W and the polishing tape 41 on the front end of the polishing head 42. During this movement, the position of the point A on the polishing tape 41 does not substantially change.

Because the polishing tape 41 is clamped by the tape transfer mechanism 43, the tension of the polishing tape 41, which is important for the polishing performance, is maintained in the region between the tape transfer mechanism 43 and the supply reel 45a. Therefore, the guide rollers 57f and 57g at the rewind-reel side are preferably located such that the guide rollers 57f and 57g do not cause an adverse effect on rewinding of the polishing tape 41. For example, the guide rollers 57f and 57g are arranged at positions such that the polishing tape 41 does not slacken too much and does not come off the guide rollers. In order to reduce the movement of the point B at the rewind-reel side, it is preferable that the guide rollers 57f and 57g be arranged such that the polishing tape 41 is returned to the rewind reel 45b via a certain point as near to the pivot Cn as possible.

In the regions between the polishing head 42 and the supply and rewind reels 45a and 45b, the polishing tape 41 hardly move or slightly move. Therefore, the tension of the polishing tape 41 can be stable, compared with the conventional linearly-reciprocating motion that causes rewinding and pulling of the polishing tape repetitively. Even when the swinging motion is performed at a high speed, an excessive tension is not applied to the polishing tape 41 when the polishing head 42 switches its movement direction. Hence, a stable polishing performance can be maintained. Furthermore, cutting or elongation (permanent strain) of the polishing tape 41 is unlikely to occur. In addition, the tension of the polishing tape 41 does not become zero, and the polishing tape 41 does not slacken.

Figure 12:
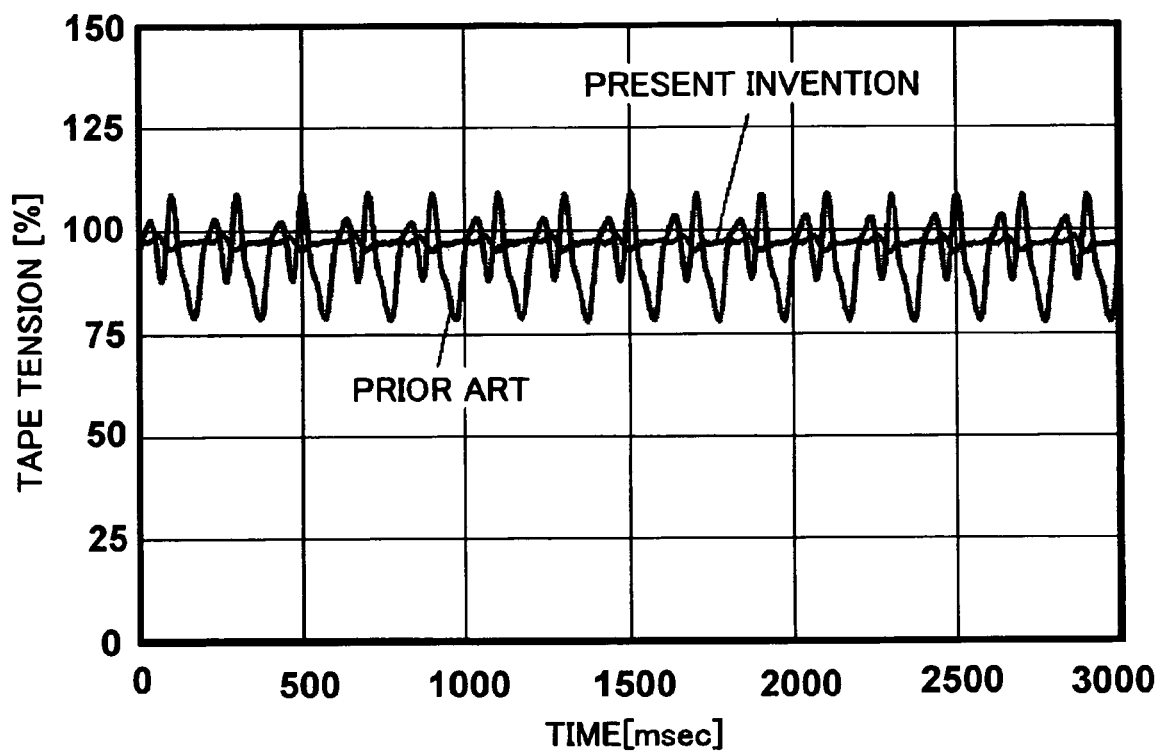
FIG. 12 is a graph showing test results of polishing of a wafer.

FIG. 12 is a graph showing an example of measurement results of the tension applied to the polishing tape when the polishing head performs the linearly-reciprocating motion (prior art) and the swinging motion (present invention). A horizontal axis shows time, and a vertical axis shows percentage that indicates actual tension of the polishing tape with respect to a preset tension as 100%. The tension was measured using a tension sensor which is commercially available.

FIG. 12 shows data that were obtained from a test that was conducted on condition that the linearly-reciprocating motion and the swinging motion of the polishing head were both performed at 300 cycles per minute. As can be seen from FIG. 12, the tension in the linearly-reciprocating motion fluctuates widely due to repetition of pulling and rewinding of the polishing tape. This is because of not only an influence of switching of the directions of the linearly-reciprocating motion, but also an influence of rolling friction resulting from a change in rotating direction of the guide rollers. On the other hand, as can be seen from FIG. 12, the tension in the swinging motion according to the present invention does not fluctuate widely and is stable. This is because the swinging motion of the polishing head 42 causes little movement of the polishing tape 41. As a result, the tape pulling and rewinding operations and the rolling friction of the guide rollers do not exert an influence on the tension of the polishing tape.

Test was further conducted on condition that both the linearly-reciprocating motion and the swinging motion of the polishing head were performed at 500 cycles per minute. This test showed that the linearly-reciprocating motion resulted in wide fluctuation in tape tension, but the swinging motion still resulted in little fluctuation in tape tension. The test results confirmed that relative speed between the polishing tape and the wafer can be increased and that the removal rate can thus be increased greatly.

Further, a time required to remove an oxide film on a notch portion of a silicon wafer having the oxide film thereon with a thickness of 100 nm was measured. As a result, the conventional polishing head performing the linearly-reciprocating motion needed 28 seconds. On the other hand, the polishing head performing the swinging motion needed 15 seconds to completely remove the oxide film. These experiments were conducted under the condition that the polishing head operated at 300 cycles per minute. When the polishing head performed the swinging motion at 500 cycles per minute, stable polishing of a wafer was still achieved. In this case, it took at most 10 seconds to completely remove the oxide film. In addition, inspection test results showed that deep scratches were less formed on the polished surface. This seems to be due to the fact that the fluctuation of the tension was small, and a large load was not applied at peaks of the fluctuation.

As described above, according to the present invention, the swinging motion can be performed at a high speed, while maintaining a stable polishing performance. Therefore, a removal amount per unit time, i.e., a removal rate, can be increased, and as a result, a throughput of the polishing apparatus can be improved.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A polishing apparatus for polishing a substrate by providing relative movement between a polishing tape and the substrate, said polishing apparatus comprising:
    a holding section configured to hold the substrate;
    a polishing head configured to bring the polishing tape into contact with a periphery of the substrate;
    a supply reel configured to supply the polishing tape to said polishing head;
    a rewind reel configured to rewind the polishing tape that has contacted the substrate; and
    a swinging mechanism configured to cause said polishing head to perform a swinging motion about a pivot to cause the polishing tape to oscillate while contacting the periphery of the substrate, wherein said swinging mechanism includes
        a swing arm to which said polishing head is fixed,
        a support arm,
        a connecting shaft rotatably coupling said support arm to said swing arm, said connecting shaft serving as the pivot of the swinging motion of said polishing head, and
        a drive mechanism configured to cause said swing arm to perform the swinging motion about said connecting shaft.

2. The polishing apparatus according to claim 1, wherein said polishing head includes a guide roller located at the pivot of the swinging motion of said polishing head, and the polishing tape extends from said supply reel to the substrate via said guide roller located at the pivot of the swinging motion of said polishing head.

3. The polishing apparatus according to claim 1, wherein the pivot of the swinging motion is positioned in said polishing head.

4. The polishing apparatus according to claim 1, wherein:
    the substrate comprises a semiconductor wafer having a notch portion formed in the periphery thereof; and
    said polishing head is configured to bring the polishing tape into contact with the notch portion.

5. The polishing apparatus according to claim 1, further comprising:
    a tilting mechanism configured to tilt said polishing head and said swinging mechanism with respect to a surface of the substrate.

6. The polishing apparatus according to claim 5, wherein said tilting mechanism includes
    a rotatable support shaft supporting said support arm, and
    a rotating mechanism configured to rotate said rotatable support shaft.

7. The polishing apparatus according to claim 6, wherein said connecting shaft and said rotatable support shaft are arranged in parallel with each other.

8. The polishing apparatus according to claim 7, wherein said swinging mechanism causes said polishing head to perform the swinging motion including rotation of said polishing head in a clockwise direction and a counterclockwise direction alternately through a same angle from a reference line, the reference line intersecting a central axis of said connecting shaft and a central axis of said support shaft at a right angle.

9. A polishing method of polishing a substrate by providing relative movement between a polishing tape and the substrate, said polishing method comprising:
    holding the substrate;
    bringing the polishing tape by a polishing head into contact with a periphery of the substrate, while supplying the polishing tape from a supply reel to the polishing head; and
    swinging the polishing head with a swinging motion of a swinging mechanism about a pivot to cause the polishing tape to oscillate while contacting the periphery of the substrate,
    wherein the swinging mechanism includes:

a swing arm to which the polishing head is fixed, a support arm, a connecting shaft rotatably coupling the support arm to the swing arm, the connecting shaft serving as the pivot of the swinging motion of the polishing head, and a drive mechanism configured to cause the swing arm to perform the swinging motion about the connecting shaft.

10. The polishing method according to claim 9, wherein the polishing tape extends from the supply reel to the substrate via a guide roller of the polishing head located at the pivot of the swinging motion of the polishing head.

11. The polishing method according to claim 9, wherein the pivot of the swinging motion is positioned in the polishing head.

12. The polishing method according to claim 9, wherein:

the substrate comprises a semiconductor wafer having a notch portion formed in the periphery thereof; and said bringing of the polishing tape by the polishing head into contact with the substrate comprises bringing the polishing tape by the polishing head into contact with the notch portion.

13. The polishing method according to claim 9, further comprising:

while said swinging of the polishing head, tilting the polishing head with respect to a surface of the substrate.

* * * * *